United States Patent
Gronbeck et al.

(10) Patent No.: US 6,773,872 B2
(45) Date of Patent: Aug. 10, 2004

(54) REDUCTION OF INORGANIC CONTAMINANTS IN POLYMERS AND PHOTORESIST COMPOSITIONS COMPRISING SAME

(75) Inventors: Dana A. Gronbeck, Holliston, MA (US); Suzanne Coley, Mansfield, MA (US); Chi Q. Truong, Westboro, MA (US); Ashish Pandya, Natick, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 190 days.

(21) Appl. No.: 10/034,756

(22) Filed: Dec. 27, 2001

(65) Prior Publication Data

US 2002/0142246 A1 Oct. 3, 2002

Related U.S. Application Data

(60) Provisional application No. 60/259,117, filed on Dec. 29, 2000.

(51) Int. Cl.$^7$ .......................... G03F 7/038; G03F 7/039; G03F 7/20; G03F 7/30; G03F 7/36
(52) U.S. Cl. ..................... 430/326; 430/325; 430/905; 430/910; 430/272.1; 430/313; 430/318; 430/311
(58) Field of Search .................. 430/270.1, 271.1, 430/306, 325, 326, 905, 914, 272.1, 311, 313, 318, 910

(56) References Cited

U.S. PATENT DOCUMENTS

| | | | | | |
|---|---|---|---|---|---|
| 5,426,014 | A | * | 6/1995 | Kelly et al. | 430/273 |
| 5,529,885 | A | * | 6/1996 | Ochiai et al. | 430/270.1 |
| 5,580,700 | A | * | 12/1996 | Rahman | 430/311 |
| 5,955,570 | A | * | 9/1999 | Rahman et al. | 528/482 |
| 6,043,002 | A | * | 3/2000 | Rahman | 430/326 |
| 6,100,373 | A | * | 8/2000 | Sheares | 528/422 |
| 6,610,465 | B2 | * | 8/2003 | Rahman et al. | 430/327 |

* cited by examiner

*Primary Examiner*—Rosemary Ashton
*Assistant Examiner*—Sin J. Lee
(74) *Attorney, Agent, or Firm*—Peter F. Corless; Darryl P. Frickey; Edwards & Angell, LLP

(57) ABSTRACT

The present invention provides polymers which are substantially or completely free of inorganic contaminants and the use of such polymers as a resin component for photoresist compositions, particularly chemically-amplified positive-acting resists. Polymers of the invention also are suitable for use as a resin component for antireflective coating compositions (ARCs). More particularly, the invention provides methods for reducing such contaminants in polymerization initiators, particularly free radical initiators.

19 Claims, No Drawings

REDUCTION OF INORGANIC CONTAMINANTS IN POLYMERS AND PHOTORESIST COMPOSITIONS COMPRISING SAME

The present application claims the benefit of U.S. Provisional Application Serial No. 60/259,117, filed Dec. 29, 2000, incorporated herein by reference.

BACKGROUND OF THE INVENTION

1. Field of the Invention

The present invention relates to the reduction of inorganic contaminants in polymers and the use of such polymers as a resin component for photoresist compositions, particularly chemically-amplified positive-acting resists. More particularly, the invention provides methods for reducing such contaminants in polymerization initiators.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive- acting photoresist, exposed portions are rendered more soluble in a developer solution while areas not exposed remain comparatively less developer soluble. In general, photoresist compositions comprise at least a resin binder component and a photoactive agent.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., *Proceedings of SPIE*, 2724:334–343 (1996); and P. Trefonas et al. *Proceedings of the 11th International Conference on Photopolymers* (*Soc. of Plastics Engineers*), pp. 44–58 (Oct. 6, 1997).

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 248 nm (provided by KrF laser) or 193 nm (provided by an ArF exposure tool). Use of such short exposure wavelengths can enable formation of smaller features. Accordingly, a photoresist that yields well-resolved images upon 248 nm or 193 nm exposure could enable formation of extremely small (e.g. sub–0.25 $\mu$m) features that respond to constant industry demands for smaller dimension circuit patterns, e.g. to provide greater circuit density and enhanced device performance.

However, many current photoresists are generally designed for imaging at relatively higher wavelengths, such as I-line (365 nm) and G-line (436 nm) exposures and are generally unsuitable for imaging at short wavelengths such as 248 nm and 193 nm. In particular, prior resists exhibit poor resolution (if any image at all can be developed) upon exposure to these shorter wavelengths. Among other things, current photoresists can be highly opaque to extremely short exposure wavelengths such as 248 nm and 193 nm, thereby resulting in poorly resolved images. Efforts to enhance transparency for short wavelength exposure can negatively impact other important performance properties such as substrate adhesion, which in turn can dramatically compromise image resolution.

It thus would be desirable to have new photoresist compositions, particularly resist compositions that can be imaged at short wavelengths such as 248 nm and sub–200 nm wavelengths such as 193 nm. It would be particularly desirable to have such resist compositions that can provide high resolution relief images, particularly small features such as sub–0.25 $\mu$m images.

SUMMARY OF THE INVENTION

In a first aspect, the invention provides novel methods for reducing inorganic contaminants in polymerization initiators, particularly free radical polymerization initiators, especially azo type initiators. Such initiators are commonly used as free radical sources in various polymerization procedures. However, we have found that commercial sources of azo type initiators all contain high levels of ionic metal contaminants, e.g., up to several tens of parts per million (ppm), particularly sodium (Na), iron (Fe), and calcium (Ca).

Depending on the quantity of initiator required for the polymerization reaction, we have found that these high levels of contaminants make it nearly impossible to achieve low metals levels, e.g., preferably less than about 20 ppb, in the finished polymer solution, even with further processing to remove the contamination. This is particularly true for sodium, which often is present in the highest concentration of the contaminant metals.

We have found that inorganic contaminants, such as sodium and other ionic metal contaminants, may be significantly reduced or eliminated from initiators prior to their use as free radical sources in polymerization procedures. Thus, using methods of the invention, low metals levels are achieved in the finished polymer. Consequently, inorganic contaminants in the resist resin component also are significantly reduced or eliminated, resulting in enhanced lithographic performance.

In addition, the use of polymerization initiators in accordance with the present invention, e.g., initiators which have reduced or even undetectable metals levels, provides a significant economic improvement in polymer manufacturing operations. For example, using initiators of the invention, cycle-time may be reduced by as much as about 60% to 90%, more preferably by as much as about 80% to 90%. Likewise, using initiators of the invention, available capacity may be increased by as much as about 200% to 400%, more preferably by as much as about 300% to 400%. Moreover, using polymerization initiators having such reduced or undetectable metals levels, the desired polymer can be made in a one-step procedure without requiring further processing time or equipment.

In contrast, using conventional methods which employ an unpurified polymerization initiator, the polymer typically must be purified using several intermediary steps. In that way, such methods require additional processing time and significant processing equipment capacity. This, in turn, limits the polymer production throughput. Furthermore, depending on the molecular weight of the polymer, we found the alternative conventional polymer purification processes to be quite tedious and at times impractical or even impossible to carry out with success.

We have found a variety of suitable methods for removal of such contaminants from free radical initiators. A preferred method employs water washing or slurrying of the initiator; another approach employs solvent precipitation of the initiator in solution; and a still further method employs a combination of aqueous precipitation of the initiator in solution and solvent exchange treatment. The method of choice depends largely on thermal stability of the initiator, and the degree and/or quantity of contaminants to be removed.

In a second aspect, the invention provides polymers which are completely or at least substantially free of inorganic contaminants, and photoresist compositions that comprise the polymers as a resin binder component. Polymers of the invention are well-suited for use in photoresist compositions. Moreover, photoresist compositions of the invention can provide highly resolved relief images, including upon exposure to short wavelengths, such as 248 nm and 193 nm.

We have found that the presence of inorganic contaminants in resists is highly undesirable in relation to the resist's lithographic performance. For example, the presence of metal contaminants is particularly problematic in that there is the potential for metal ions to migrate from the resist into the underlying substrate and to cause potential electrical shorts in the patterned chip. Accordingly, the present invention provides resist polymers which are completely or at least substantially free of inorganic contaminants.

Polymers of the invention can be prepared by a variety of methods. One particularly preferred method is a radical chain reaction which includes free radical in polymerization, e.g., by reaction of selected monomers in the presence of a radical initiator. Monomers that can be reacted to provide a polymer of the invention can be readily identified by those skilled in the art. For example, suitable monomers include e.g., acrylonitrile, methacrylonitrile, allylcyanide, itaconic anhydride and the like. A variety of free radical initiators may be employed. Particularly preferred free radical initiators include azo compounds such as diazo alkylcarbonitrile initiators (e.g., Vazo 52, 64, 67 and 88). In accordance with the invention, suitable initiators will contain reduced levels of inorganic contaminants as noted above.

In preferred embodiments of the invention, it is possible to achieve significant reduction or even elimination of ionic metal contaminants in the finished polymer. For example, using methods of the invention, levels of ionic metal contaminants in the finished polymer solution are achieved of less than about 50 part per billions (ppb), more preferably less than about 30 ppb, most preferably less than about 20 ppb, or even less than about 10 ppb. Further, using an additional purification step following the polymerization reaction, e.g., using an ion-exchange treatment, chromatography or distillation, such levels can be reduced to an even lower level. In particularly preferred embodiments, polymers of the invention are completely free of inorganic contaminants.

Generally preferred photoresists of the invention are chemically-amplified positive-acting resists containing polymers which are completely or substantially free of inorganic contaminants. The resin typically will contain additional units such as pendant photoacid-labile units such as provided by polymerization of a suitable acrylate e.g., tertbutyl acrylate or tertbutyl methylacrylate; carboxylic acid units; cyano units such as provided by polymerization of acrylonitrile or methyl acrylonitrile; aromatic units such as provided by polymerized optionally substituted styrene or vinylphenol units, alicyclic units such as provided by polymerization of vinyl olefins such as vinyl isobornyl, etc.

In yet a further aspect of the invention, polymerization initiators having reduced or even undetectable metals levels also are suitable for preparing specialized polymers for use in connection with antireflective layers or antireflective compositions (ARCs). For example, in an effort to reduce the incidence of reflected radiation, certain radiation absorbing layers have been interposed between the substrate surface and the photoresist coating layer. ARCs typically contain a chromophore that absorbs exposure radiation and is bound covalently to a resin component of the ARC. In particular, polymerization initiators of the invention are useful in preparing polymers for use as ARC resins. In that way, the underlying ARC polymer and the resulting ARC composition.

In yet another aspect, the invention provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate or liquid crystal display or other flat panel display substrate having coated thereon a polymer, photoresist or resist relief image of the invention. In each case, it is a critical feature of the invention that inorganic contaminants, e.g., ionic metal contaminants, be reduced or eliminated from the underlying polymer and the resulting resist composition.

Other aspects of the invention are disclosed infra.

DETAILED DESCRIPTION OF THE INVENTION

As noted above, a first aspect of the invention provides methods for the reduction inorganic contaminants in polymerization initiators prior to use of the initiator as a free radical source during polymerization. Particularly preferred for use in accordance with the invention are azo type polymerization initiators.

We have found a variety of suitable preferred methods for removal of such contaminants from initiators. The method of choice depends on thermal stability of the initiator, and the degree and/or quantity of contaminants to be removed.

One preferred method includes water washing or slurrying of the initiator. Such method typically comprises grinding the initiator into small particulates, and admixing, in slurry form, the initiator with cool Deionized (DI) water. It is generally preferred that about 10 parts water be used per part of initiator by weight, though the skilled artisan will appreciate that such a ratio may vary widely. A contact or mixing time of less than about one hour is generally suitable. However, a mixing time of even about 30 minutes is sufficient. The cake is then recovered easily by filtering of the slurry and the washing procedure is preferably repeated about two more times. The wet cake is then placed in a vacuum oven and dried at ambient temperature to achieve a moisture content of about 0.2% or less.

An alternate preferred method includes an aqueous precipitation of the initiator in solution. Such method generally comprises admixing the initiator with a suitable organic solvent, e.g., acetone or the like, and slowly precipitating the initiator/acetone solution in water. It is generally preferred that the ratio of initiator to DI water be as follows: about 1 part of initiator (dry basis) to about 40 parts of water. As in the case above, such ratios may be varied widely and still produce good results. Such method further comprises admixing the slurry and filtering the slurry to recover the cake. The cake is preferably reslurried, e.g., using about 1 part of initiator (dry basis) to about 10 parts of water, mixed or otherwise contacted for an additional period of time, and filtered to recover the cake. The wet cake is then preferably dried, e.g., in a vacuum oven at ambient temperature, until the moisture content is about 0.2% or less.

Yet another preferred method of the invention includes a combination of an aqueous precipitation of the initiator solution and solvent exchange. Such methods generally comprise admixing the initiator in a suitable organic solvent, e.g., acetone or the like, slowly precipitating the initiator/acetone solution in water, e.g., using about 1 part of initiator (dry basis) to about 10 parts of water; mixing/contacting for a suitable period of time and filtering the slurry to recover the cake. The cake is preferably reslurried, e.g., using about 1 part of initiator (dry basis) to about 10 parts of water, mixed for an additional period of time, and filtered to recover the cake. A solution is then prepared of the initiator and a suitable organic solvent. In preferred embodiments, such a solution preferably contains about 10% to about 50% solids, more preferably about 20% to about 30% solids, or most preferably about 30% solids on a "wet cake basis". However, such percentage may be varied widely and still produce good results. Particularly preferred solvents include methyl-tert-butyl-ether (MTBE) and the like. Vacuum stripping is subsequently employed to remove the MTBE or other solvent. Other generally preferred organic solvents include tetrahydrofuran, other ethers, ketones, esters and the like.

In preferred embodiments of the invention, it is possible to achieve metals levels (e.g., for each of Na, Ca, and Fe) in the polymerization initiator of less than about 20 ppm, more preferably less than about 10 ppm, still more preferably less than about 500 ppb, and most preferably less than about 250 ppb. The skilled artisan will appreciate that such determinations may be made using a variety of standard metals analysis techniques.

Using the preferred methods of the invention, it is possible to achieve a percent reduction of metals levels (e.g., for each of Na, Ca, and Fe) in the initiator on the order of about 25% to about 100%, more preferably from about 50% to about 100%, still more preferably from about 75% to about 100%.

In a second aspect, the invention provides polymers that are completely or at least substantially free of inorganic contaminants. As used herein, polymers of the invention which are "substantially free" of inorganic contaminants are those polymers which contain less than about 50 ppb, more preferably less than about 30 ppb, still more preferably less than about 20 ppb, or even less than about 10 ppb of inorganic contaminants, as determined by standard metals analysis techniques. In particularly preferred embodiments, polymers of the invention are completely free of inorganic contaminants. Such reduced or non-detectable levels of inorganic contaminants may be achieved in accordance with the invention by purifying the polymerization initiator prior to synthesis of the polymer, optionally followed by an additional purification step, e.g., using an ion-exchange treatment, chromatography or distillation procedure.

As noted above, polymers of the invention are preferably prepared by free radical polymerization, e.g., by reaction of selected monomers in the presence of a radical initiator which has a reduced level of inorganic contaminants. Such reactions are typically carried out under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, dimethylformamide and the like. Suitable reaction temperatures for any particular system can be readily determined empirically by those skilled in the art based on the present disclosure. Monomers that can be reacted to provide a polymer of the invention can be readily identified by those skilled in the art. For example, suitable monomers include e.g., acrylonitrile, methacrylonitrile, allylcyanide, itaconic anhydride and the like. A variety of free radical initiators may be employed to prepare the copolymers of the invention. Particularly preferred free radical initiators include azo compounds such as diazo alkylcarbonitrile initiators (e.g., Vazo 52, 64, 67 and 88). Though generally less preferred, peroxides, peresters, peracids and persulfates also could be employed. In accordance with the invention, suitable initiators will contain reduced levels of inorganic contaminants as noted above. See, also, the Examples which follow for synthesis and use of preferred resin binders prepared in accordance with the invention.

Preferably a polymer of the invention will have a weight average molecular weight ($M_w$) of 1,000 to about 500,000, more preferably from about 1,000 to about 100,000, still more preferably from about 2,000 to about 30,000, yet more preferably from about 2,000 to 15,000 or 20,000, with a molecular weight distribution ($M_w/M_n$) of about 3 or less, more preferably a molecular weight distribution of about 2 or less. Molecular weights (either $M_w$ or $M_n$) of the polymers of the invention are suitably determined by gel permeation chromatography.

In yet another aspect of the invention, polymerization initiators having reduced or even undetectable metals levels also are suitable for preparing specialized polymers for use in connection with antireflective layers or antireflective compositions (ARCs). For example, in an effort to reduce the incidence of reflected radiation, certain radiation absorbing layers have been interposed between the substrate surface and the photoresist coating layer. See, for example, PCT Application WO 90/03598, EPO Application No. 0 639 941

A1 and U.S. Pat. Nos. 4,910,122, 4,370,405 and 4,362,809, all incorporated herein by reference for their teaching of antireflective (antihalation) compositions and the use of same. See, also, European Application 542 008 A1, for its disclosure of highly useful antihalation (antireflective) compositions that comprise a resin binder and a crosslinker compound. Additional highly useful ARCs are disclosed in U.S. Pat. Nos. 5,939,236 and 5,886,102.

ARCs typically contain a chromophore that absorbs exposure radiation. Preferably, such chromophores are bound covalently to a resin component of the ARC. As will be appreciated by the skilled artisan, such a resin component typically comprises a polymer. In accordance with the methods set forth herein, the ARC polymer may be suitably prepared using polymerization initiators of the invention which have reduced or undetectable metals levels. In that way, the underlying polymer and resulting ARC composition will have reduced or undetectable metals levels.

ARCs also preferably comprise a crosslinker. In that way, the antireflective coating layer can avoid intermixing of resist and ARC layers and, in at least some systems, crosslink with an overcoated layer of a photoresist composition, thereby increasing adhesion between the two coating layers. The crosslinker preferably can be thermally activated. The crosslinker can be comprised of a variety of materials, and preferably is an amine based material, such as a glycouril resin.

ARCs also may comprise an acid or thermal acid generator to catalyze the reaction between the resin binder and the crosslinking compound, enabling the crosslinking reaction to proceed at relatively lower temperatures. As used herein, the term "acid generator" refers to a compound that generates an acid upon appropriate treatment of the compound, for example, upon exposure to activating radiation or thermal treatment.

In practice, an antireflective composition of the invention is applied as a coating layer to a substrate may any of a variety of methods such as spin coating. The antireflective composition, in general, is applied on a substrate with a dried layer thickness of between about 0.02 and 0.5 $\mu$m, preferably a dried layer thickness of between about 0.04 and 0.20 $\mu$m. The substrate is suitably any substrate conventionally used in processes involving photoresists. For example, the substrate can be silicon, silicon dioxide or aluminum-aluminum oxide microelectronic wafers. Gallium arsenide, ceramic. quartz or copper substrates may also be employed. Substrates used for liquid crystal display or other flat panel display applications are also suitably employed, for example glass substrates, indium tin oxide coated substrates and the like.

Preferably the antireflective layer is cured before a photoresist composition is applied over the ARC. Cure conditions will vary with the components of the ARC. Thus, if the composition does not contain an acid or acid generator, cure temperatures and conditions will be more vigorous than those of a composition containing an acid or acid generator compound. Typical cure conditions are from about 120° C. to 225° C. for about 0.5 to 40 minutes. Cure conditions preferably render the ARC coating layer substantially insoluble to the photoresist solvent as well as an alkaline aqueous developer solution. Additionally, as discussed above, if the ARC includes a photoacid generator, the composition coating layer can be at least partially cured by exposing the coating layer to an effective amount of activating radiation (e.g., between about 10 to 300 mJ/cm$^2$), followed by a post-exposure bake of from 50 to 225° C.

After such curing a photoresist is applied over the surface of the ARC. As with application of the ARC, the photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the ARC layer and photoresist layer should occur.

The resist layer is then imaged with activating radiation through a mask in conventional manner, e.g., at 193 nm or 248 nm. The exposure energy is sufficient to effectively activate the photoactive component of the resist system to produce a patterned image in the resist coating layer, more specifically, the exposure energy typically ranges from about 3 to 300 mJ/cm$^2$ depending upon the exposure tool. The exposed resist layer may be subjected to a post-exposure bake if desired to create or enhance solubility differences between exposed and unexposed regions of a coating layer. For example, negative acid hardening photoresists typically require post-exposure heating to induce the acid promoted crosslinking reaction, and many chemically amplified positive acting resists require post exposure heating to induce an acid promoted deprotection reaction. Typically post-exposure bake conditions include temperatures of about 50° C. or greater, more specifically a temperature in the range of from about 50° C. to 160° C.

The exposed resist coating layer is then developed, preferably with an aqueous based developer such as an inorganic alkali exemplified by tetrabutyl ammonium hydroxide, sodium hydroxide, potassium hydroxide, sodium carbonate, sodium bicarbonate, sodium silicate, sodium metasilicate, aqueous ammonia or the like. Alternatively, organic developers can be used. In general, development is in accordance with art recognized procedures. Following development, a final bake of an acid-hardening photoresist is often employed at temperatures of from about 100 to 150° C. for several minutes to further cure the developed exposed coating layer areas.

The developed substrate may then be selectively processed on those substrates areas bared of photoresist, for example chemically etching or plating substrate areas bared of photoresist in accordance with procedures well known in the art. Suitable etchants include a hydrofluoric acid etching solution and a plasma gas etch such as an oxygen plasma etch. As detailed above, the plasma gas etch will remove the antireflective at an enhanced rate relative to prior compositions.

As discussed above, we have discovered that the presence of inorganic contaminants, e.g., ionic metal contaminants, in a resist resin component is highly undesirable. For example, the presence of metal contaminants is particularly problematic in that there is the potential for metal ions to migrate from the resist into the underlying substrate and to cause potential electrical shorts in the patterned chip.

Using methods of the invention, the inorganic contaminants present in free radical initiators are significantly reduced or eliminated prior to their use in polymerization reactions. Thus, it is possible to dramatically reduce the levels of such contaminants in the finished polymer.

For example, the typical as-received sodium content of diazo-alkylcarbonitrile initiators (e.g., VAZO 67, VAZO 52) is about 150–200 ppm, which subsequently dilutes as much as 2.5 ppm in the polymer reaction solution, making the initiator the single largest source of metal contamination for AR and 193 polymers. This level of sodium is particularly problematic for products formulated directly from the reaction solution and also leads to a high metal contaminant level in polymers isolated by precipitation from a non-solvent. The use of water as a precipitation solvent can further reduce the sodium level. However, in cases where the non-solvent is a hydrocarbon (such as hexanes for 193 polymers), no additional metal reduction would be expected, and the burden of metal reduction would have to be borne by an ion-exchange step alone.

A substantial portion of the contaminating metals, particularly sodium, can be removed prior to polymerization by using the methods of the present invention, i.e., by washing the initiator with water, by admixing the initiator with acetone followed by water precipitation, optionally followed by solvent exchange. For example, using methods of the invention, sodium can be reduced from 2.5 ppm (without treatment) to about 150 ppb in solutions of the finished polymer, e.g., AR5/6/7 polymer. Similar results are expected for AR8, AR19, other 193 nm AR polymers, and for radically initiated 193 nm resist polymers (such as the K-, P-, MK- or ML- series). Reducing the metals levels initially by a total reduction (acetone/water washing) as opposed to ion exchange alone is expected to decrease the overall ionic strength of the solution, thereby making any post-polymerization metal reduction by a subsequent ion-exchange process more effective.

As noted above, methods for reducing metallic and other inorganic contaminants from the initiator include grinding of the initiator into small particles; slurrying the initiator several times in water or admixing the initiator with acetone and precipitating in water, filtering to recover the cake, and drying the initiator under vacuum at ambient temperature.

It also is noted that depending on the reactivity of the initiator, all the above steps may be done under room temperature or even sub-room temperature (e.g., as for VAZO 52).

Polymers of the invention are highly useful as a resin binder component in photoresist compositions, particularly chemically-amplified positive resists. Photoresists of the invention in general comprise a photoactive component and a resin binder component that comprises a polymer as described above. The resin binder component should be used in an amount sufficient to render a coating layer of the resist developable with an aqueous alkaline developer.

For positive-acting chemically-amplified photoresist applications, polymers of the invention are typically employed that contain a photoacid labile group. A variety of photoacid labile groups can be employed in the polymers, including those groups identified in the above-cited patents. Preferred acid labile groups include pendant esters, particularly ester groups provided by polymerization of acrylate monomers. For instance, preferred acid-labile groups include those provided by polymerization of t-butyl acrylate and t-butyl methacrylate.

Preferred acid-labile groups also include pendant ester groups that contain an optionally substituted alkyl moiety typically having about 4 or more carbon atoms with a fully-substituted carbon (i.e., quaternary) linked to the ester oxygen, such as t-butyl and the like.

Polymers of the invention may contain units in addition to the alkyl esters units described above. For example, polymers may contain additional photoacid-labile groups such as pendant esters such as those of the formula —WC(=O)OR$^5$, wherein W is a linker such as a chemical bond, an alkylene particularly C$_{1-3}$ alkylene, or carbocyclic aryl such as phenyl, or aryloxy such as phenoxy, and R$^5$ is a suitable ester moiety such as an optionally substituted alkyl (including cycloalkyl) suitably having from 1 to about 20 carbons, more preferably about 4 to about 12 carbons, but without a noncyclic or single ring alkyl group having 5 or more carbons and two or more secondary, tertiary or quaternary carbons; optionally substituted alkenyl (including cycloalkenyl) group suitably having from 2 to about 20 carbons, more preferably about 4 to about 12 carbons; optionally substituted alkynyl group suitably having from 2 to about 20 carbons, more preferably about 4 to about 12 carbons; optionally substituted alkoxy group suitably having from 1 to about 20 carbons, more preferably 2 to about 12 carbons; or a heteroalicyclic group that contains one or more N, O or S atoms and one or more rings having from 4 to about 8 ring members such as tetrahydrofuranyl, thienyl, tetrahydropyranyl, morpholino and the like. Specifically preferred R$^5$ groups include e.g. t-butyl, tetrahydropyran, ethoxyethyl, or an alicyclic group including bridged groups such as such as adamantyl including 2-methyl-2-adamantyl, norbornyl, isobornyl and the like.

Polymers of the invention optionally may contain other groups that contribute to aqueous developability of a photoresist. For example, preferred polymer groups that contribute to aqueous developability contain carboxy or hydroxy moieties such as may be provided by condensation of vinylaryl such as vinylphenol which may be provided by condensation of vinylphenol, acrylic acid, methacrylic acid, 2-hydroxyethylmethacrylate, or other hydrophilic monomers.

Other optional polymer units include those that may be provided by condensation of a vinyl alicyclic group, e.g. 2-adamantyl-2-methyl methacrylate, isobornyl methacrylate and the like, or a non-cyclic alkyl group such as t-butyl methacrylate and the like, or a vinyl nitrile such as condensation of methacrylonitrile to provide pendant cyano groups. Pendant cyano, acid (COOH), and/or alicyclic groups, such as those mentioned above, are generally preferred additional units of polymers of the invention.

For use in photoresists to be imaged at 193 nm and other sub-200 nm wavelengths, preferably a polymer of the invention will be substantially free of any phenyl or other aromatic groups. For example, preferred polymers contain less than about 5 mole percent aromatic groups, more preferably less than about 1 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Polymers of the invention used in positive-acting chemically-amplified photoresist formulations should contain a sufficient amount of photogenerated acid labile ester groups to enable formation of resist relief images as desired. For instance, suitable amount of such acid labile ester groups will be at least I mole percent of total units of the polymer, more preferably about 2 to 50 mole percent, still more typically about 3 to 30 or 40 mole percent of total polymer units. See the examples which follow for exemplary preferred polymers.

Photoresists of the invention in general comprise a photoactive component and a resin binder component that comprises a polymer as described above.

The resin component should be used in an amount sufficient to render a coating layer of the resist developable with an aqueous alkaline developer.

The resist compositions of the invention also comprise a photoactive component that typically is a photoacid generator (i.e. "PAG") and that is suitably employed in an amount sufficient to generate a latent image in a coating layer of the resist upon exposure to activating radiation. A variety of photoacid generators may be employed. Preferred PAGs for imaging at 193 nm and 248 nm imaging include imidosulfonates.

Sulfonate compounds also are particularly suitable PAGs, especially sulfonate salts. Two specifically preferred agents for 193 nm and 248 nm imaging are the following PAGs 1 and 2: (These are generally referred to as iodonium PAGs.)

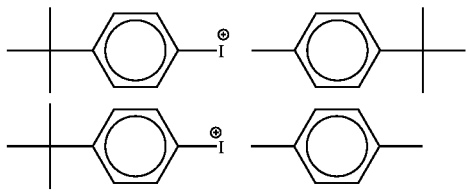

Such sulfonate compounds can be prepared as disclosed in European Patent Application 96118111.2 (publication number 0783136). Briefly, PAG 1 can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to 5–10° C. and then (+/−)-10-camphorsulfonic acid added followed by neutralization with ammonium hydroxide. Sulfonate PAG 2 above can be prepared by those same procedures, except approximately molar equivalents of t-butyl benzene and benzene would be reacted together in the first step with acetic anhydride and $KIO_3$.

Also suitable are the above two iodonium compounds complexed with anions other than the above-depicted camphorsulfonate groups. In particular, preferred anions include those of the formula $RSO_3^-$ where R is adamantane, alkyl (e.g., $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention. Particularly for 193 nm imaging, generally preferred are PAGS that do not contain aromatic groups, such as the above-mentioned imidosulfonates, in order to provide enhanced transparency. The bis(sulfonyl) diazomethanes are another class of widely used PAGs which are suitable for use in the present invention.

The invention also includes negative-acting photoresists that comprise a polymer of the invention. Negative resists typically contain a crosslinking component in addition to a photoactive component and a polymer of the invention. Suitable crosslinkers include amine-based materials, e.g. a melamine such as the melamine-formaldehyde resins sold under the Cymel tradenames. For a negative resist, a polymer need not contain photoacid-labile units as discussed above with respect polymers for use in chemically-amplified positive resists. Suitable negative-acting resists have been generally described in U.S. Pat. Nos. 5,128,232 and 5,340,696 to Thackeray et al.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 $mJ/cm^2$, dependent upon the exposure tool and the components of the photoresist composition.

As discussed above, coating layers of the resist compositions of the invention are preferably photoactivated by a short exposure wavelength, particularly a sub–300 and sub–200 nm exposure wavelength. Particularly preferred exposure wavelengths include 193 nm and 248 nm. However, the resist compositions of the invention also may be suitably imaged at higher wavelengths. For example, a resin of the invention can be formulated with an appropriate PAG and used as a chemically-amplified positive I-line resist, i.e. a resist imaged at about 365 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $Cl_2$ or $CF_4/CHF_3$ etchant applied as a plasma stream. After such processing, resist may be removed from the processed substrate using known stripping procedures.

The invention also includes polymers that contain one or more of the above features. For instance, preferred are terpolymers, tetrapolymers, pentapolymers or other higher order polymers that contain at least the above groups 1) through 3), i.e. 1) (photoacid-labile group); 2) (polymerized electron-deficient monomer); and 3) (polymerized cyclic olefin moiety), preferably where at least two distinct units 1) through 3) each has photoacid labile groups, e.g. the cyclic olefin unit may have a photoacid-labile group.

Also preferred are terpolymers, tetrapolymers, pentapolymers or other higher order polymers that contain at least the above groups 1) through 3), and where the polymer contains a photoacid labile group that contains a tertiary ester alicyclic hydrocarbon group that has two or more fused or bridged rings, and preferably is other than adamantyl.

Polymers of the invention also may contain units in addition to the above groups. For example, polymers of the invention also may contain nitrile units such as provided by polymerization of methacrylonitrile and acrylonitrile. Additional contrast enhancing groups also may be present in polymers of the invention, such as groups provided by polymermization of methacrylic acid, acrylic acid, and such acid protected as photoacid labile esters, e.g. as provided by reaction of ethoxyethyl methacrylate, t-butoxy methacrylate, t-butylmethacrylate and the like.

All documents mentioned herein are incorporated herein by reference. The following general procedures and non-limiting examples are illustrative of the invention.

General Procedures

1. Water washing method.

Grind the initiator to small particulates.

Mix, in slurry form, initiator with 20° C. water, preferably using about 10 parts of water per part of initiator by weight.

Mix for 30 minutes and filter the slurry to recover the cake.

Repeat the washing process two more times.

Place wet cake in vacuum oven and dry, e.g., at 20° C. for 72 hours or until the moisture is about 0.2% or less.

2. Aqueous precipitation of an initiator solution.

Dissolve 1 part of initiator in 2 parts of 20° C. solvent, e.g., acetone.

Slowly precipitate initiator/acetone solution in 20° C. water. Use 1 part of initiator (on dry basis) to 40 parts of water.

Mix for 30 minutes and filter the slurry to recover the cake.

Re-slurry the cake using 1 part of initiator (dry basis) to 10 parts of water.

Mix for 30 minutes and filter to recover the cake.

Place wet cake in vacuum oven and dry, e.g., at 20° C. for 72 hours or until the moisture is about 0.2% or less.

3. Combination of aqueous precipitation of an initiator solution and solvent exchange.

Dissolve 1 part of initiator in 3 parts of 10° C. solvent, e.g., acetone.

Slowly precipitate initiator/acetone solution in 10° C. water. Use 1 part of initiator (on dry basis) to 10 parts of water.

Mix for 30 minutes and filter the slurry to recover the cake.

Re-slurry the cake using 1 part of initiator (dry basis) to 10 parts of water.

Mix for 30 minutes and filter to recover the cake.

On "wet cake basis", prepare a 30% solids solution of initiator and solvent, e.g., 10° C. methyl-tert-butyl-ether (MTBE).

Vacuum strip at 10° C. to remove MTBE.

EXAMPLE 1

The following results were obtained using polymerization initiators Vazo-52 and Vazo-67:

TABLE 1

Metals Contents of Initiators Before and After Purification

| Before (Na, Fe, Ca respectively) | After (Na, Fe, Ca) | % Reduction (Na, Fe, Ca) | Method |
|---|---|---|---|
| 61.8 ppm, 7.8 ppm, 1.1 ppm | 10.8 ppm, 3.6 ppm, 334 ppb | 83, 54, 70 | 1 |
| 45 ppm, 3.2 ppm, 2.4 ppm | 570 ppb, 2.2 ppm, 140 ppb | 98, 31, 94 | 2 |
| 59 ppm, 1.7 ppm, 1.7 ppm | 235 ppb, 908 ppb, 1.3 ppm | 99, 47, 24 | 3 |

TABLE 2

Metals Contents in Polymers With and Without Initiators Purified

| Without purification (Na, Fe, Ca) in ppb | With purification (Na, Fe, Ca) in ppb | Method | After Ion-Exchange (Na, Fe, Ca) in ppb |
|---|---|---|---|
| 2572, 83, 46 | NA | NA | 1734, 75, 34 |
| NA | 379, 78, 13 | 1 | 14, 12, 5* |
| NA | 260, 11, 10 | 2 | NA |
| NA | 73, 27, 9 | 3 | NA |

Observations

All three methods are effective in removing metals contamination from the initiators. As such, this makes it possible to produce polymers having significantly reduced levels of inorganic contaminants so that an ion-exchange process can be used to further remove any remaining residual metals. On the other hand, without purifying the initiators, the metals contents in the final polymer would be too high. The ion-exchange process, by itself, is not sufficient for removing metals at such high levels.

The foregoing description of the invention is merely illustrative thereof, and it is understood that variations and modification can be made without departing from the spirit or scope of the invention as set forth in the following claims.

What is claimed is:

1. A method for forming a photoresist relief image comprising:
   (a) preparing a polymer by steps comprising ad mixing one or more polymerizable monomers with a polymerization initiator which has been purified prior to admixing with the one or more monomers;
   (b) applying a coating layer of a photoresist composition on a substrate, the photoresist composition comprising a photoactive component and a resin component, the resin component comprising the polymer of step (a) which is at least substantially free of ionic metal contaminants;
   (c) exposing the photoresist composition coating layer to patterned activating radiation and
   (d) developing the exposed photoresist coating layer to provide a photoresist relief image.

2. The method of claim 1 wherein the initiator has been purified with an aqueous solvent prior to admixing the initiator with the one or more monomers.

3. The method of claim 1 wherein the initiator has been purified with an organic solvent prior to admixing the initiator with the one or more monomers.

4. The method of claim 1 wherein the photoresist composition is a chemically-amplified positive photoresist and the polymer comprises photoacid-labile groups.

5. The method of claim 4 wherein the polymer comprises polymerized acrylate groups.

6. The method of claim 4 wherein the polymer comprises phenolic groups.

7. The method of claim 4 wherein the initiator is a free radical polymerization initiator.

8. The method of claim 4 wherein the initiator is an azo polymerization initiator.

9. A method for forming a photoresist relief image comprising:
   (a) treating a polymerization initiator to remove metal contaminants and preparing a polymer with the treated initiator, wherein the treated polymerization initiator has a concentration of each of Na, Ca and Fe of less than 20 ppm;
   (b) admixing the polymer and one or more photoacid generator compounds to prepare a photoresist composition;
   (c) applying a coating layer of the photoresist composition on a substrate;
   (d) exposing the photoresist composition coating layer to patterned activating radiation; and
   (e) developing the exposed photoresist coating layer to provide a photoresist relief image.

10. The method of claim 9 further comprising treating the polymerization initiator with an aqueous solvent prior to preparing the polymer.

11. The method of claim 9 further comprising treating the initiator with an organic solvent prior to preparing the polymer.

12. The method of claim 9 wherein the photoresist composition is a chemically-amplified positive photoresist and the polymer comprises photoacid-labile groups.

13. The method of claim 9 wherein the polymer comprises polymerized acrylate groups.

14. The method of claim 9 wherein the photoresist layer is exposed with radiation having a wavelength of less than 200 nm.

15. The method of claim 14 wherein the substrate is a silicon microelectronic wafer substrate and areas bared of photoresist by development are etched.

16. The method of claim 9 wherein the treated polymerization initiator has a concentration of each of Na, Ca and Fe of less than 500 ppb.

17. The method of claim 9 wherein the treated polymerization initiator has a concentration of each of Na, Ca and Fe of less than 250 ppb.

18. The method of claim 9 wherein the initiator is a free radical polymerization initiator.

19. The method of claim 9 wherein the initiator is an azo polymerization initiator.

* * * * *